(12) United States Patent (10) Patent No.: US 7,471,710 B2
Cliche et al. (45) Date of Patent: Dec. 30, 2008

(54) NARROW LINEWIDTH SEMICONDUCTOR LASER DEVICE

(75) Inventors: Jean-François Cliche, Quebec (CA);
Michel Tetu, Cap-Rouge (CA);
François Baribeau, Charlesbourg (CA);
Stéphane Blin, Lannion, CA (US);
Martin Guy, Cap-Rouge (CA)

(73) Assignee: Teraxion Inc., Quebec (CA)

( * ) Notice: Subject to any disclaimer, the term of this patent is extended or adjusted under 35 U.S.C. 154(b) by 44 days.

(21) Appl. No.: 11/318,060

(22) Filed: Dec. 23, 2005

(65) Prior Publication Data

US 2006/0159135 A1 Jul. 20, 2006

(30) Foreign Application Priority Data

Dec. 24, 2004 (CA) .................................. 2491700

(51) Int. Cl.
*H01S 3/00* (2006.01)
(52) U.S. Cl. .............................. 372/38.08; 372/38.02
(58) Field of Classification Search ........................ None
See application file for complete search history.

(56) References Cited

U.S. PATENT DOCUMENTS

| 6,005,995 | A  | * | 12/1999 | Chen et al. ..................... 385/39 |
| 6,175,320 | B1 | * | 1/2001  | Heflinger ........................ 385/40 |
| 6,522,206 | B1 | * | 2/2003  | Kornblum et al. ........... 331/1 A |
| 6,801,324 | B1 | * | 10/2004 | Gray et al. ..................... 372/32 |
| 6,891,149 | B1 |   | 5/2005  | Lewis et al. |
| 2002/0018496 | A1 | * | 2/2002 | Gutin ........................... 372/20 |
| 2002/0081089 | A1 | * | 6/2002 | Min et al. ..................... 385/40 |
| 2005/0018987 | A1 | * | 1/2005 | Ruf et al. ..................... 385/125 |

OTHER PUBLICATIONS

Cliche, Jean-François et al., "Effect of Laser Linewidth Reduction Systems on Coherence Length and Interferometer Noise", presented at IEEE LEOS Summer Tropical 2005, Jul. 26, 2005, 2p., San Diego, U.S.A.

Cranch, G. A., "Frequency Noise Reduction of Erbium-Doped Fiber Distributed-Feedback Lasers by Electronic Feedback", Optics Letters, Jul. 2, 2002, pp. 1114-1116, vol. 27, No. 13.

(Continued)

*Primary Examiner*—Minsun Harvey
*Assistant Examiner*—Sean Hagan
(74) *Attorney, Agent, or Firm*—Darby & Darby PC

(57) ABSTRACT

A narrow linewidth semiconductor laser device has a semiconductor laser and a low noise current source operatively connected to the laser with the current source being adapted to prevent degradation of the laser's frequency noise spectrum. An optical frequency discriminator provides an error signal representative of the laser's optical frequency and a control circuit has a feedback network that provides a frequency feedback signal that is adapted to the frequency noise spectrum of the frequency discriminator and to the laser's frequency noise spectrum and tuning response. The control circuit also has a sequencer to automatically enable frequency locking of the laser on the frequency reference of the optical frequency discriminator. An enclosure encloses the frequency discriminator to isolate the frequency discriminator from external perturbations. The device provides an improved sub-kHz linewidth and a high coherence while being compact, lightweight and highly reliable, as well as being automatically operated.

30 Claims, 8 Drawing Sheets

OTHER PUBLICATIONS

Li, Linlin, The Optimal Loop Gain Design for the Spectral Linewidth Reduction in an Electrical Feedback Semiconductor Laser, IEEE Journal of Quantum Electronics, Aug. 1991, pp. 1975-1980, vol. 27, No. 8.

Montalvo, Amando, "White Paper: Low Cost Lasers for Optical Fiber Sensing Applciations", Aragon Technologies, Inc., 2003, 8p., Van Nuys, U.S.A.

Notcutt, Mark et al., "Simple and Compact 1-HZ Laser System via an improved Mounting Configuration of a Reference Cavity", Optics Letters, Jul. 15, 2005, pp. 1815-1817, vol. 30, No. 14.

Ohtsu, Motoichi et al. "Electrical Feedback and its Network Analysis for Linewdith Reduction of a Semiconductor Laser.", Journal of Lightwave Technology, Mar. 1988, pp. 357-369, vol. 6, No. 3.

Ohtsu, Motoichi et al., "FM Noise Reduction and Subkilohertz Linewidth of an AlGaAs Laser by Negative Electrical Feedback", IEEE Journal of Quantum Electronics, Feb. 1990, pp. 231-234, vol. 26, No. 2.

Ohtsu, Motoichi et al., "Linewidth Reduction of a Semiconductor Laser by Electrical Feedback", IEEE Journal of Quantum Electronics, Dec. 1985, pp. 1905-1912, vol. QE-21, No. 12.

Ohtsu, Motoichi, "Realization of Ultrahigh Coherence in Semiconductor Lasers by Negative Electrical Feedback", Journal of Lightwave Technology, Feb. 1988, pp. 245-256, vol. 6, No. 2.

* cited by examiner

NARROW LINEWIDTH SEMICONDUCTOR LASER DEVICE

FIELD OF THE INVENTION

This invention generally relates to the field of high precision optical measurement and high resolution spectral analysis, and more particularly to the field of optical fiber sensing, laser radars (LIDARS), distance measurement, gas analysis, optical filter analysis, optical signal analysis and heterodyne detection. Thus, the present invention concerns a narrow linewidth semiconductor laser particularly adapted for these applications.

BACKGROUND OF THE INVENTION

Many applications require laser sources that offer a narrow linewidth, a high degree of coherence and low optical phase noise.

Long baseline interferometry, for instance, rely on highly coherent lasers to detect extremely small length changes over tens and hundreds of kilometers by observing the change of phase of an optical beam after propagating through that distance. Gravitational wave detectors, formation-flying satellites and length-stabilized fiber distribution systems also uses such techniques. A laser source possessing a coherence length much longer than the path length is required in order to produce interference fringes to be detected with a good signal to noise ratio.

Microwave and millimeter wave generation is another application where two low phase noise optical beams are combined within a high speed photodetector or a photomixer to produce an RF signal at the frequency difference between the two beams. Since it is relatively easy to frequency tune lasers over hundreds of GHz, widely tunable RF generators can therefore be achieved. Since the phase noise of the RF carrier is the sum of the uncorrelated phase noise of both lasers, it is important to have lasers with maximum coherence and minimum phase noise.

Some types of LIDARs such as DIAL (Differential absorption LIDAR) and Doppler LIDAR also rely on the heterodyne detection of the reflected laser signal (delayed pulses or phase shifted cw) with the local laser oscillator in order to detect the frequency shifts induced by moving or vibrating remote objects. Here again, the signal to noise ratio of the received signal will depend on the degree of coherence of the laser pulse after its round trip.

Some types of fiber sensors also require narrow linewidth light source to perform sensitive measurements with high signal to noise ratio. Applications such as hydrophonic or seismic detector arrays, distributed temperature and pressure sensors, or structural monitoring for buildings, bridges, roads, ships and aircraft can all benefit from a narrow-linewidth laser source.

Narrow-linewidth lasers are often also used as seed lasers to synchronize more powerful lasers or amplifiers which inherit the linewidth and coherence of the seeder laser.

For those applications and many more, the use of high spectral purity (extremely narrow linewidth) lasers is mandatory. Linewidth lower than a few kHz is often required in many applications. In some cases, the lasers must be installed on moving platforms, aircrafts and satellites where size, weight, power consumption, robustness and reliability constraints are of prime importance. For applications where a large number of narrow linewidth lasers are required, cost is also a major issue. Some applications may also require the laser output to be provided with specific optical polarizations in polarization-maintaining fibers.

Different types of narrow linewidth lasers are currently available to the market. These are described below.

YAG lasers are bulk crystal, optically or electrically pumped, lasers. In some of their realizations, they offer relatively high power and narrow linewidth (5 kHz) but are bulky and relatively power inefficient. Single mode operation is also difficult to sustain without requiring the addition of special external controls like magnetic field, strain, temperature and so on.

Fiber lasers offer a very interesting alternative to these solutions. The most attractive designs are built with Bragg gratings written in or around an Erbium doped amplifying fiber pumped by one or more semiconductor lasers. They offer natural linewidths below the kHz level and are built entirely out of fiber. They are lightweight and compact, and can provide large amounts of output optical power. One drawback is that they require specialty fibers with gratings, which can be expansive to produce and may not be well suited for some space application due to radiation sensitivity. Another drawback comes from their sensitivity to environmental perturbations like vibrations, acoustic noise, strain or temperature. Their linewidth, even if it is small, is not sufficient for applications where coherence length grater than 50 km is required. Other types of fiber laser use optical resonators, like ring cavity or Fabry-Perot, with optical filters to select one emission wavelength. These lasers are even more difficult to put under stable and reliable operation mode. Since fiber lasers rely on a high power semiconductor laser to pump the active Erbium-doped fiber and do not use the output of the laser directly, these laser sources tend to be more complex, more costly, less reliable and less efficient than the simple semiconductor lasers they are made of.

It would be extremely advantageous to use telecommunication-grade semiconductor lasers as laser sources for the above-mentioned applications. Indeed, such lasers benefit from many years of intensive developments efforts that have been invested over the last decades to produce low cost, reliable optical sources for the telecommunication industry. Mass production of such lasers allow them to be available at a very low cost. Mature laser architecture and packaging techniques make these lasers extremely reliable. Many lasers comply with the Telcordia standards which ensure the performance of the laser for decades in harsh environmental conditions. A number of space-qualified semiconductors are also already available. Modern semiconductor lasers can provide output power levels exceeding 50 mW, and new generation of lasers can provide many hundreds of milliwatts, which is sufficient for many applications.

Unfortunately, although semiconductor lasers have a number of highly desirable characteristics for the targeted applications, their linewidth is often too large to be useful. Indeed, the linewidth of semiconductor lasers is typically greater than a few hundreds of kilohertz, which makes their coherence length too short and their phase noise too high for applications requiring high spectral purity sources.

Various techniques have been developed to enhance the spectral quality of semiconductor lasers. External cavity lasers (ECL) rely on a mechanical cavity to feedback light in the active region of a semiconductor laser in order to reduce the linewidth of that laser. The mode-hop free operation of laser with such an optical feedback depends on the mechanical stability of the optical set-up, which may be difficult to maintain. The typical linewidth of such lasers is typically 100 kHz or less when measured over short periods of time, and increase over longer measurement periods due to the laser's inherent frequency sensitivity to acoustic and mechanical noise. This linewidth is not sufficiently narrow for high precision applications. Laser based on micromechanically-tuned cavity offer better robustness and immunity to vibrations, but their linewidth is still generally beyond the kHz level.

Other techniques which do not rely on alignment-sensitive optical have been demonstrated to reduce the natural linewidth of semiconductor lasers. One of these consists in using a highly sensitive optical filter used as a frequency discriminator to measure the frequency fluctuations of the laser, and to apply an electrical signal back to the laser to tune its frequency so as to compensate these optical frequency fluctuations. This frequency locking system essentially transfers the short-term frequency stability of the frequency discriminator to the laser. If the optical frequency discriminator has a low frequency noise in the locking bandwidth, the laser will inherit this low noise and will display a narrower linewidth.

Such a linewidth reduction system is demonstrated by Ohtsu, M. and N. Tabuchi in "Electrical Feedback and Its Network Analysis for Linewidth Reduction of a Semiconductor-Laser.", Journal of Lightwave Technology Vol. 6, No 3, pp-357-369, 1988. In these experiments, the light from a semiconductor laser is sent through a free-space Fabry-Perot resonator used as frequency discriminator that converts the frequency fluctuations in intensity variations which are measured by a photodetector. A specially-designed feedback circuitry, which takes into account the frequency tuning response of the laser, imposes frequency corrections to the laser by changing its injection current. The drawback of this approach is that the Fabry-Perot resonators are bulky devices that are susceptible to acoustic and mechanical noise and require optical alignments. Such a frequency discriminator is therefore not appropriate for use in mobile platforms or noisy environments.

Solid-state, all-fibers Mach-Zehnder interferometers are common devices that offer sharp frequency response and that can be used as more convenient frequency discriminators than free-space Fabry-Perot resonators. Such interferometers can be made small, lightweight and low-cost. U.S. Pat. No. 6,891,149 granted to Lewis et al. describes a frequency locking system using such Mach-Zehnder interferometer to generate the electrical feedback signal to reduce the frequency noise of a laser source. Such a frequency locking system can advantageously be used with semiconductor lasers to reduce their linewidth. A similar system was shown by Cranch, G. A. in "Frequency noise reduction in erbium-doped fiber distributed-feedback lasers by electronic feedback.", Optics Letters Vol. 27, No 13, pp-1114-1116, 2002, to reduce the linewidth of a DFB fiber laser. Both solutions rely on the use of a dual output Mach-Zehnder interferometer with two photodetectors connected so as to measure the differential power in the two output branches to generate a frequency error signal. These dual photodetector systems cannot make use of the monitoring photodetector that is often already included in telecommunication semiconductor lasers, therefore uselessly increasing the component count. The proposed dual-photodetector systems are not designed to use other types of other frequency discriminators such as all-fiber Michelson interferometers, which may be more advantageous to reduce the fiber length and reduce mechanical sensitivity.

Therefore, there is a need for a low-cost semiconductor laser source that can offer narrow linewidths while being power efficient, compact, lightweight, and highly reliable. Moreover, to overcome the disadvantages of the prior art devices, it would be desirable that they use the minimum of components, the smallest frequency discriminators, and be as immune to external perturbation as possible. It would also be desirable that they provide the maximum performance that can be achieved by using low noise current source, and take into account the frequency noise spectrum of the laser and frequency discriminator, and the tuning response of the laser. It would also be desirable that they operate automatically without user intervention.

It would also be desirable to provide a narrow linewidth laser that can be continuously frequency-tuned over a large frequency range.

It would also be desirable to provide a high coherence light source whose frequency is extremely stable or is known with high accuracy.

SUMMARY OF THE INVENTION

An object of the present invention is to provide a narrow linewidth semiconductor laser satisfying the above-mentioned needs.

Accordingly, there is provided a narrow linewidth semiconductor laser device. The narrow linewidth semiconductor laser device has a semiconductor laser having a predetermined frequency noise spectrum and a predetermined tuning response. The semiconductor laser has tuning means and operates at an optical frequency tuneable by the tuning means. The laser also has an output signal.

The narrow linewidth semiconductor laser device is provided with a low noise current source operatively connected to the laser for supplying current thereto. The current source is particularly adapted to prevent a significant degradation of the frequency noise spectrum of the laser.

The narrow linewidth semiconductor laser device is also provided with an optical frequency discriminator for providing a frequency reference for the laser. The optical frequency discriminator has a frequency noise spectrum and is operatively connected to a portion of the output signal of the laser to provide an error signal representative of the optical frequency of the laser in response thereto.

The narrow linewidth semiconductor laser device also has control means operatively connected to the error signal and to the laser tuning means. The control means has a feedback network for providing a frequency feedback signal. The feedback network is adapted to the frequency noise spectrum of the frequency discriminator, the frequency noise spectrum of the laser and the tuning response of the laser. The control means also has sequencing means for allowing to automatically enable frequency locking of the laser on the frequency reference of the optical frequency discriminator.

The narrow linewidth semiconductor laser device is also provided with an enclosure for enclosing the frequency discriminator to isolate the frequency discriminator from external perturbations.

Advantageously, the narrow linewidth semiconductor laser device of the present invention allows to provide an improved sub kHz linewidth while being compact, lightweight and highly reliable.

Moreover, the narrow linewidth semiconductor laser device of the present invention can advantageously be automatically operated.

In a preferred embodiment, the present narrow linewidth semiconductor laser device of the present invention can advantageously be continuously frequency-tuned over a large frequency range.

BRIEF DESCRIPTION OF THE DRAWINGS

Other objects and advantages of the present invention will become apparent upon reading the detailed description and upon referring to the drawings in which.

Figure 1:
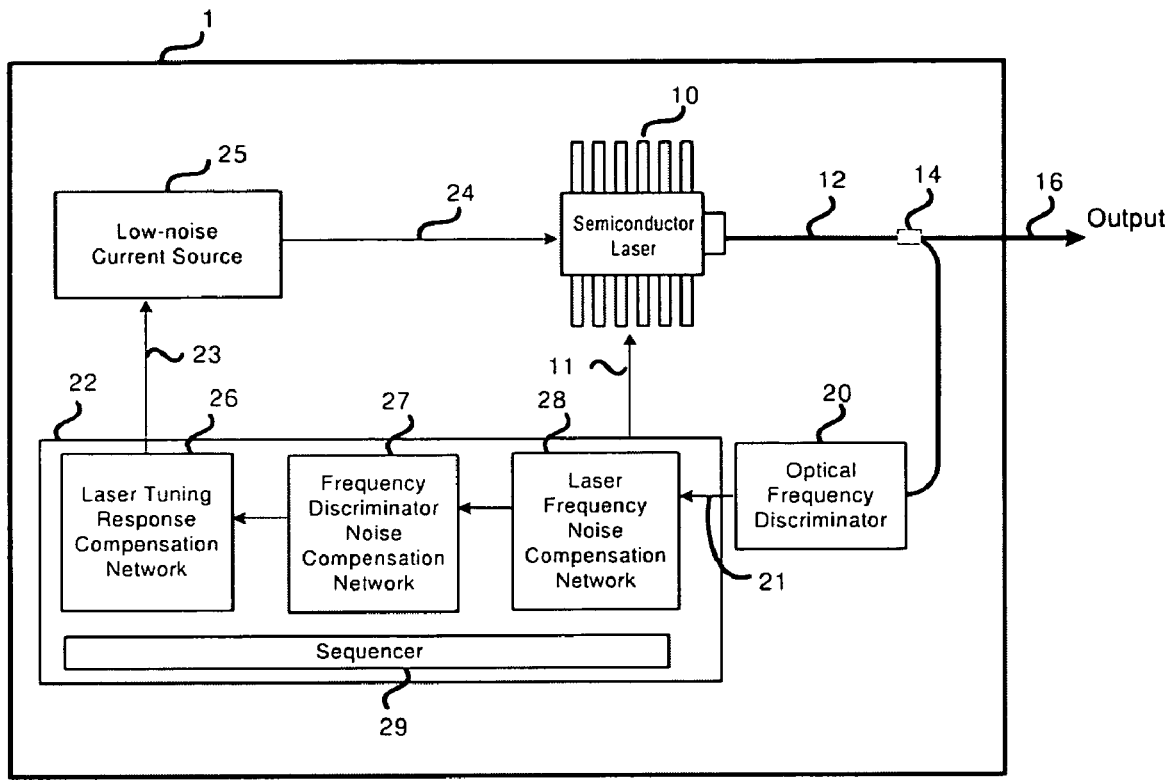
FIG. 1 is a schematic representation of a narrow linewidth semiconductor laser device according to the present invention.

While the invention will be described in conjunction with examples of preferred embodiments, it will be understood that it is not intended to limit the scope of the invention to such embodiments. On the contrary, it is intended to cover all alternatives, modifications and equivalents as may be included as defined by the appended claims.

DETAILED DESCRIPTION OF PREFERRED EMBODIMENTS

In the following description, similar features in the drawings have been given similar reference numerals and in order to lighten the figures, some elements are not referred to in some figures if they were already identified in a precedent figure.

The linewidth of semiconductor can be reduced by sending the laser light into a frequency discriminator that converts the frequency noise of the laser into intensity noise, by measuring this intensity with a photodetector and use this signal to compensate the frequency fluctuations of the laser by varying its injection current in an appropriate manner. Once the frequency locking loop thus described is established, the laser frequency will track very accurately the frequency fluctuations of the frequency discriminator within the bandwidth of that locking loop. The laser will therefore inherit the stability of the frequency discriminator. The short and medium term frequency noise of a well-designed frequency discriminator can be much lower than the natural frequency noise of the laser. If the locking bandwidth is sufficiently high, the frequency-locked laser will therefore inherit this low frequency noise, which will result in a reduced linewidth and an increased coherence length. Sub-kHz linewidth are easily obtainable for measurement periods below 1 ms.

Many important issues that are critical in the realization of practical high spectral purity, very narrow linewidth semiconductor lasers have generally been neglected in the prior art. In our practical experience in designing such systems, maximum performances can only be achieved if the following elements are designed into the narrow linewidth semiconductor laser device.

First, some modern high performance telecommunication semiconductor lasers display frequency noise spectra that significantly differ from older semiconductor lasers. The presence of dominant white frequency noise is often assumed, although this assumption is generally not adequate. The knowledge of the precise frequency noise spectrum of the laser can be used to tailor the frequency response of the feedback loop with specially-designed electronic networks, therefore enabling the linewidth reduction system to perform at its best. The same principle also applies to the frequency noise of the frequency discriminator.

Second, the response of the laser in response to frequency tuning is generally complex due to the combined effect of the carriers and the local heating in the semiconductor junction. Here again, knowing the exact frequency response of the laser can be used to design an appropriate electronic compensation network that will allow the locking loop to achieve greater bandwidths, and therefore produce higher spectral purity lasers.

Third, modern high power semiconductor lasers can operate at high power levels and can require injection current on the order of hundreds of milliamperes or even amperes. Furthermore, such a current source must be modulated at high frequencies to provide a means for the frequency locking loop to tune the laser frequency. To achieve maximum performance, it is important to ensure that the current noise of these high-power modulated laser drivers is low enough so that the frequency noise spectrum of the laser is not significantly degraded. This issue is also often overlooked with lower power lasers. It is therefore important to integrate an appropriate current source with the semiconductor laser and electronic feedback system if maximum performance is to be achieved.

Fourth, since the frequency noise of the frequency discriminator is transferred to the laser by the electrical locking loop, it is important to package this frequency discriminator in such a way that it will be minimally affected by external perturbations such as temperature fluctuations, mechanical constraints and vibrations, acceleration and acoustical noise. This packaging is an important part of the laser's ultimate performance.

Fifth, some applications might require means to adjust the frequency of the frequency discriminator in order to continuously tune the frequency-locked laser over a frequency range larger than one period of the frequency discriminator response. In addition, there must be a low-cost means to lock the narrow-linewidth laser on an external molecular or atomic reference in order to increase the long-term frequency stability of the laser.

Sixth, to allow proper operation of the narrow linewidth laser device, it is necessary for the system to have a controller which will sequentially set the laser operating parameters and enable the locking loop only once the operating conditions of both the laser and the frequency discriminator are sufficiently stable. Such a sequence is also required to lock the laser on a different part of the frequency discriminator response upon the user request. Failure to properly sequence the operation of the laser may cause the laser to display erratic behavior for some time after power-up and during tuning, which is not desirable in applications where high reliability is required.

Referring to FIG. 1, there is shown a narrow linewidth semiconductor device (1) according to the present invention, which includes the critical design elements mentioned above to allow the laser to achieve its maximum performance.

As illustrated, a semiconductor laser (10) emits light (12) which is separated in two parts by an optical splitting device (14). One part of the light is used as the user output (16), while the other part is sent to the frequency discriminator (20) to perform the frequency locking. The splitting ratio can be adjusted to ensure sufficient power is available to the frequency discriminator to perform adequate frequency locking. A power level of a few milliwatts is typically sufficient.

Advantageously, the laser output is pigtailed and an optical fiber coupler is used to perform the splitting. A polarization-maintaining coupler can be used if the user output requires an output with predetermined polarization alignment. In such a case, a semiconductor laser with a polarization-maintaining output fiber should preferably be used.

The frequency discriminator (20) is a device that provides an electrical signal that change in accordance with the frequency of the laser. It converts the frequency noise of the laser into an electrical amplitude noise we called frequency error signal (21). This frequency discriminator can be implemented in various ways, those of which are described in a further section of this description. It will generally comprise an optical filter followed by a photodetector to convert the intensity of the light into an electrical signal. Preferably, the sensitivity of the frequency discriminator must be high enough so that the natural frequency fluctuations generate an signal that clearly stand out from the noise caused by the intensity fluctuations of the laser, the optical shot noise, and the electronics thermal noise.

A controller (22) receives this error signal and applies a correction signal (23) to a laser tuning means to compensate for the frequency fluctuations of the laser. The correction is advantageously continuously performed in order to maintain this error signal as close as possible to zero.

In a preferred embodiment, the laser tuning means is implemented by a laser injection current source (25) whose output current (24) can be varied as a function of the correction signal (23). The change in injection current will changes the frequency of the laser, therefore providing the required frequency tuning.

Both the laser and the frequency discriminator possess some levels of frequency noise. Depending on the type and model of the semiconductor laser used, the frequency noise spectrum of the laser will vary. Some semiconductor lasers have dominant white frequency noise, which means that the frequency fluctuations that will need to be corrected by the feedback loop will have to operate over a broad range of frequencies. Some semiconductor lasers exhibit dominant flicker (or 1/f) frequency noise, which indicates that the amplitude of the natural frequency fluctuations of the laser varies inversely with the frequency at which these fluctuations occur. This means that a significant portion of the frequency fluctuations of the laser occur at lower frequencies, but that the amplitudes of the slow fluctuations can be very high. Consequently, depending on the exact frequency noise properties of the laser, the locking loop must advantageously apply stronger correction for some frequency ranges than others in order to minimize the residual closed loop noise. According to the invention, we include an electronic compensation network (28) that is designed to generate a correction signal whose gain and bandwidth is adapted to the specific frequency response of the laser.

According to a preferred embodiment, a typical basic laser frequency noise compensation network will consist in a simple integrator, which will provide moderately high feedback gain at low frequencies. A double integrator or an integrator with a compensated additional integrator can further boost the gain at lower frequencies and provide better noise reduction for lasers exhibiting flicker frequency noise, while preserving the loop stability. A correction signal, preferably substantially proportional to the error signal, can also be added to provide higher gain at high frequency for those lasers having some levels of white frequency noise.

The frequency discriminator can also be a source of frequency noise. When the laser is locked to the frequency discriminator, the noise on this frequency discriminator will be transferred to the laser within the bandwidth of the locking loop. Ambient acoustic tonalities and mechanical oscillations can create harmonic fluctuations of the frequency of the discriminator. Here again, it is advantageous to know the spectrum of such frequency fluctuations and adapt the response of the frequency locking loop in order to prevent the laser from tracking these unwanted noise sources. According to the invention, an additional electrical network (27) that adjusts the frequency response of the feedback loop to ensure that it will not track the unwanted noise coming from the frequency reference is advantageously used. With proper electronic filtering, the requirements on the frequency discriminator packaging could then be relaxed.

If a frequency discriminator is used in a quiet environment, there may be no need for a sophisticated compensation network. If, however, noise at specific frequencies or specific frequency bands negatively affect the frequency discriminator, the compensation network can implement notch filters to reduce the gain of the loop in the frequency ranges of interest. This would prevent the frequency noise to be transferred to the laser at these frequencies. The laser would therefore retain its own natural frequency noise at these frequencies. Other type of filters such as high pass and low pass filters could advantageously be used, depending on the noise characteristics of the frequency discriminator.

Another advantageous function of the frequency discriminator compensation network (27) is to compensate for the inherent frequency response of the frequency discriminator. Typical frequency discriminators (including interferometers) have a sensitivity that varies as a function of the frequency at which the noise occur. Furthermore, the frequency discriminator can introduce significant optical delays that could create additional phase shifts and destabilize the frequency locking loop. An additional role of the frequency discriminator compensation network is therefore to ensure that these effects will not affect the loop performance. Lead-lag networks could be added to the filter design to compensate for the interferometer delay and allow an increase of the loop gain and bandwidth, therefore providing better frequency noise reduction on the laser and a narrower linewidth. Other types of compensation networks could advantageously be used depending on the characteristics of the frequency discriminator response.

According to a preferred embodiment, the frequency of the laser is advantageously tuned by changing the injection current of the laser. This approach has the advantage that it does not require any external components and that it allows high tuning bandwidth to be achieved. However, the response of the laser to frequency tuning is not instantaneous and generally shows a complex behavior. Indeed, the change in the injection current not only changes the carrier density in the junction, but also affects the power generated in the form of heat in that junction due to its electrical resistance and its voltage drop. Both the carrier density and junction temperature affect the laser's optical frequency. The heat generated in the junction will propagates outward through non-homogenous layers of materials constituting the laser, channels through the laser mounting structure, and eventually reaches the thermistor that is used to sense the laser's temperature and control it to a predetermined value. The temperature controller will then react to the perceived change in temperature and attempt to cool the laser, which will again change the laser's frequency. The consequence of this is that the frequency response of the tuning mechanism is not uniform but rather displays varying sensitivity and phase changes as a function of the tuning signal frequency.

The role of the laser tuning response compensation network (26) is to compensate for the complex frequency response of the laser in order to allow the frequency locking loop to achieve greater loop gain and bandwidth. A lead-lag network, tuned to the thermal response of the laser, can effectively allow the loop bandwidth to be increased by a factor of two. Other compensation network topologies can advantageously be used to maximize the loop bandwidth depending on the laser tuning response.

The current source (25) provides the injection current (24) to the semiconductor laser. In the preferred embodiment of this invention, this current can be modulated by applying a frequency correction signal (23). The modulation bandwidth of the injection current tuning must be high enough to avoid limiting the bandwidth of the frequency locking loop. Typical bandwidths are in the order of a few tens of MHz.

High power semiconductor lasers can require a few amperes of current. Since the noise on the laser current will translate into optical frequency noise, it is imperative for the current noise to be small enough so that the frequency noise of the laser is not degraded. Typically, current levels below 0.7 µA RMS (from 1 Hz to 100 kHz) with current levels of 1 A are required. Unfortunately, increasing the modulation bandwidth of the current source also increases its noise levels. Low noise and high bandwidth are two conflicting requirements, but both are required in order to achieve maximum performance from the narrow linewidth laser. Implementing such a current source requires a very careful electronic design.

In a preferred embodiment of the invention, a dual-stage current source in which a high current source is connected in parallel with a high bandwidth, low current source is advantageously used. The high current source provides a very low noise current which is either fixed or can be changed only slowly in order to allow the electronics circuitry to efficiently filter out the electronic noise that could be transferred to the current. The high bandwidth source adds or removes a small current to the laser. Since the current range is small, the noise on that current is also small even if the source is susceptible to noise over a wider range of frequencies. Since the frequency locking loop generally needs only to apply small frequency corrections to the laser, only small current modulation is required. This configuration is therefore particularly adapted to the narrow linewidth laser device of the present invention.

As an advantageous improvement, the current source could be made to control simultaneously both the high current source and the high bandwidth source in order to provide a high current tuning range and large tuning bandwidth.

According to the invention, the locking loop controller (22) comprises a sequencer which plays an important role in automating the operations of the narrow linewidth laser device. Indeed, the frequency locking loops cannot be activated immediately after the power is applied to the laser device. The frequency locking loop must be activated only when the frequency of the laser is sufficiently stable and is close to the desired frequency reference of the frequency discriminator. One of the critical functions of the sequencer is to ensure the proper power-up sequence is performed. This power-up sequence can advantageously comprise the following steps:

First, the sequencer sets the semiconductor laser temperature by applying the appropriate control signal to the laser temperature controller (not shown) and set the nominal injection current by applying the appropriate signal on the low noise current source.

Second, the sequencer waits until the frequency of the laser stabilizes.

Third, the sequencer enables the frequency locking loop.

The second step could consist in waiting for a fixed delay after power-up. However, it would be advantageous for the sequencer to monitor the error signal coming from the frequency discriminator and determine that the laser is sufficiently stable from that signal. In a preferred embodiment, the frequency discriminator provides an error signal that varies periodically with the laser frequency, and the stability condition is detected when the periodic fluctuations of the error signal slow down below a predetermined rate.

The sequencer can optionally send a "Ready" signal to the user when the laser frequency locking is completed. This signal can take the form of a visual indicator, a analog or digital signal, or a digital flag that could be queried by the user using a specific digital communication protocol.

Similarly, the sequencer can also optionally provide an "Error" to indicate that the locking did not take place in time, or that a fault condition has been detected in one of the system's components.

The sequencer can advantageously be implemented using simple discrete state machines which control the analog locking electronics circuitry with preset levels.

According to a preferred embodiment, the sequencer is implemented by a microprocessor with embedded software that performs the functions described before.

In a further preferred embodiment, the sequencer provides a standard digital communication port to the user to allow remote control and monitoring of the narrow linewidth laser device. The communication port can be any of GPIB, SPI, 12C, RS-232, CANBus, or any other standard protocol.

Figure 2:
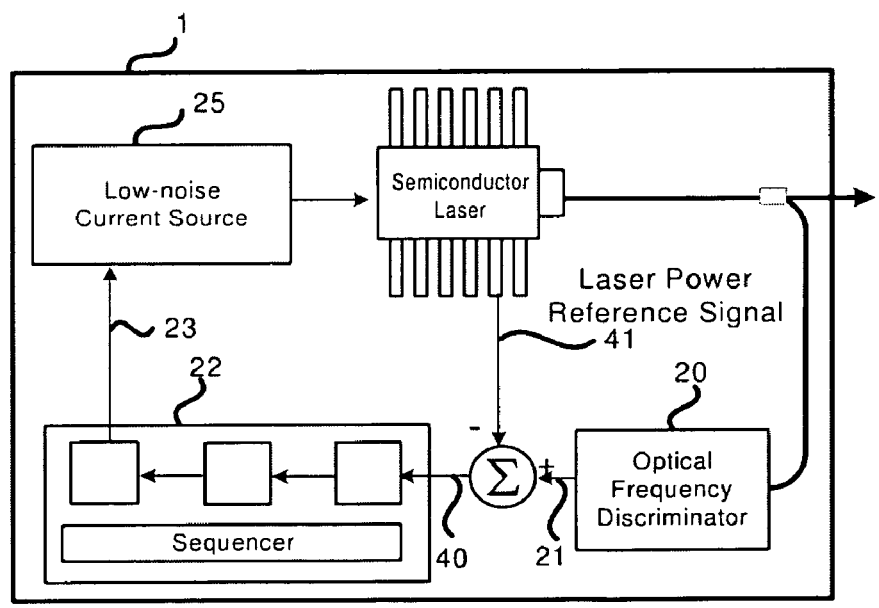
FIG. 2 is a schematic representation of a narrow linewidth semiconductor laser device according to a preferred embodiment of the present invention.

FIG. 2 illustrates another preferred embodiment of the present invention where the laser power level signal (41) obtained from a power monitoring photodiode integrated with the semiconductor laser package is subtracted from the output (21) of the frequency discriminator (20). This configuration advantageously allows the frequency discriminator to provide a frequency error signal whose amplitude is dependent not only on the frequency of the laser but also its power. By subtracting a quantity proportional to the laser power, the effects of the laser power fluctuations can be eliminated. The resulting corrected error signal (40), which is sent to the controller (22), ensures that the locking loop will not significantly change the laser frequency as a result of laser power fluctuations.

The advantage of this approach is that it allows many types of frequency discriminators to be used within the narrow linewidth laser device. Indeed, many frequency discriminators do not inherently provide an error signal that is independent of the laser power. This approach allows the use of these frequency discriminators. Furthermore, the use of the laser monitoring photodiode can eliminate the need to use a second photodetector in the frequency discriminator.

Alternatively, the laser power reference signal could be obtained by using a tap coupler to sample part of the light of the laser and by using a photodetector to convert its power into an electrical signal.

A divider could also advantageously be used instead of the subtractor to generate a modified frequency error signal that is independent from the laser power.

Figure 3:
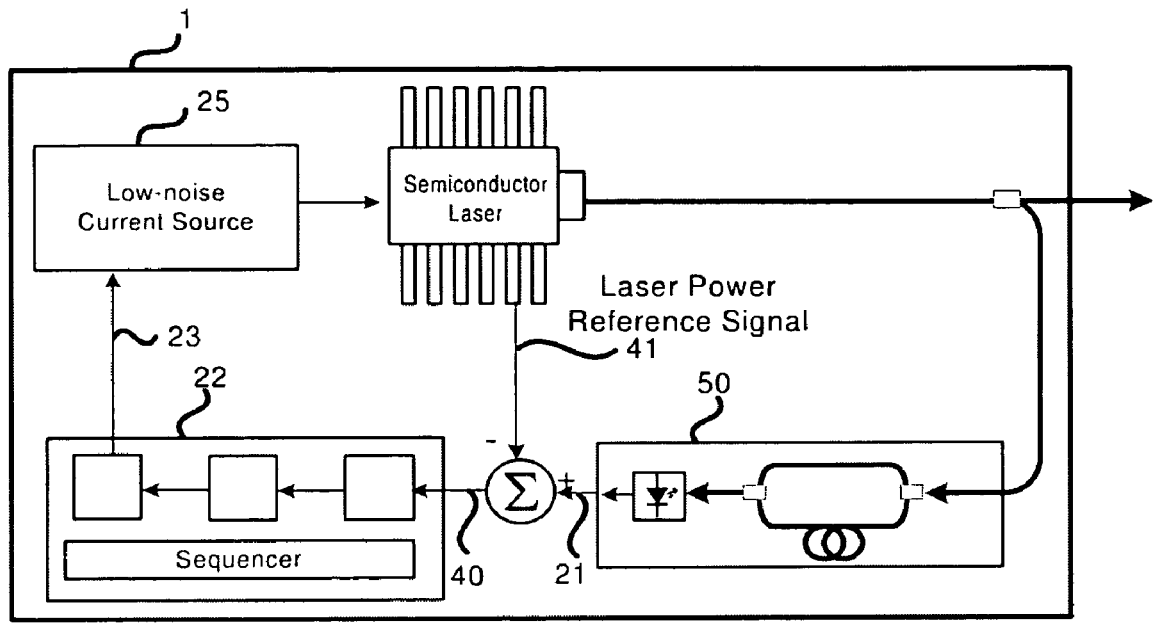
FIG. 3 is a schematic representation of a narrow linewidth semiconductor laser device according to another preferred embodiment of the present invention.

FIG. 3 illustrates a preferred embodiment where a fibered Mach-Zehnder interferometer followed by a photodetector is used as a frequency discriminator. A polarization maintaining fiber can be advantageously used to ensure the polarization stability of the optical signals in the interferometer.

Alternatively, a Mach-Zehnder interferometer followed by a pair of differentially coupled photodetectors could be used to generate a frequency error signal that is independent from the laser power fluctuations.

Figure 4:
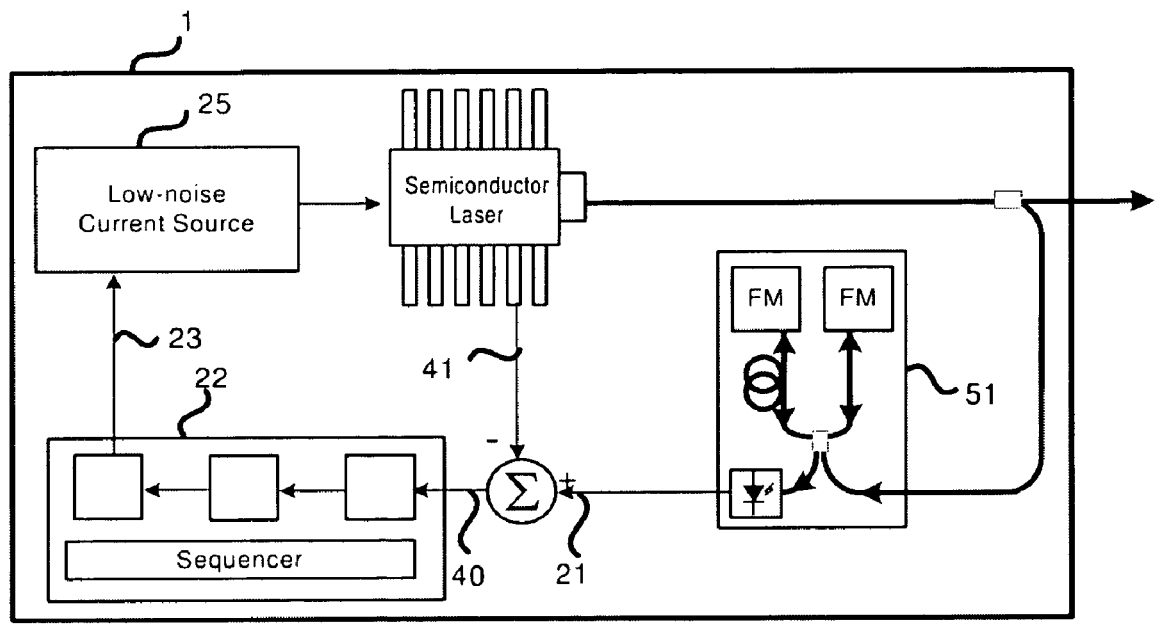
FIG. 4 is a schematic representation of a narrow linewidth semiconductor laser device according to another preferred embodiment of the present invention.

FIG. 4 illustrates another preferred embodiment where the frequency discriminator is implemented as an all-fibered Michelson interferometer followed by a photodetector. Preferably, an all-fiber Michelson interferometer with Faraday mirrors and standard single-mode fiber is used to avoid polarization issues. The use of polarization maintaining fiber can also eliminate the need of Faraday mirrors. The advantage of the Michelson interferometer relative to the Mach-Zehnder interferometer is that it requires half the length of fiber to achieve the same interferometric delay. The interferometer can therefore be less sensitive to environmental perturbations.

Various types of fibers could be advantageously be used to implement all-fibered frequency discriminators. Fibers with low temperature coefficient could advantageously be used to provide additional long term frequency stability on the frequency-locked laser. Crystalline fibers or holey fibers can also advantageously be used for their particular mechanical and optical properties. Furthermore, the hollow cavities in the fiber could be filled with a reference gas which will absorb the light or create a optical phase shift at given optical frequencies. This would realize a complex filter that could be used to perform both linewidth reduction and long-term frequency stabilization of the laser.

Figure 11:
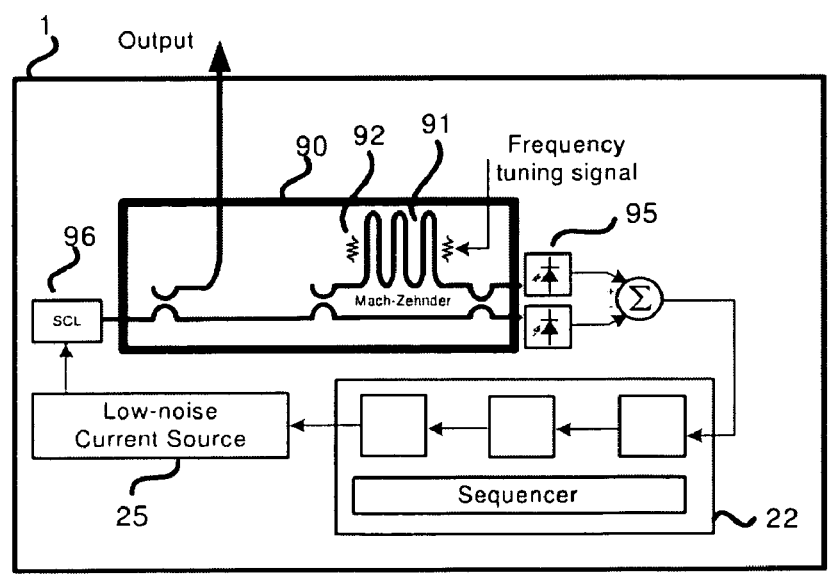
FIG. 11 is a schematic representation of a narrow linewidth semiconductor laser device according to another preferred embodiment of the present invention.

The above mentioned interferometers could also be integrated as waveguides on miniature photonic lightwave circuit for maximum integration, as shown in FIG. 11. Referring to this figure, a photonic lightwave circuit chip (90) comprises a waveguide (91) which implements a Mach-Zehnder interferometer. In the presented implementation, the interferometer followed by a pair of differentially coupled photodetectors (95) could be used to generate a frequency error signal that is independent from the laser power fluctuations. The resulting error signal is sent to a loop controller (22) that frequency locks the laser (96) by injection current corrections through the low noise current source (25).

The advantages of such a set-up are that the laser, interferometer and electronics can be integrated in a extremely small and light package, while still providing a very narrow linewidth laser source. The laser (96) and photodetectors (95) can be attached in chip format to the photonic circuit, therefore eliminating all fiber except the output fiber. The small size and low weight of the device makes it easier to protect against external thermal, acoustic and mechanical perturbations.

A tuning means could also be advantageously integrated on this integrated frequency discriminator. A preferred method is by changing the length of one arm of the interferometer using a heating element designed onto the photonic circuit. Alternatively, a piezo transducer can be used to create a local mechanical constraint to perform this length variation. Integrated phase modulators could also be used to create a phase shift in one arm of the interferometer, therefore allowing fast tuning of the frequency-locked laser.

Other types of frequency discriminator can be implemented using waveguides on a photonic circuit, such as a Michelson interferometer. An optical resonator such as a Fabry-Perot or a ring resonator could also be used in a similar fashion.

The frequency discriminator can also be implemented as optical band pass filter, for which the laser frequency is on the edge of the transmission curve. Such devices could be based on Bragg gratings, on monolayer or multilayer thin film filters, on atomic or molecular absorption lines and like devices.

In many applications, it would be advantageous to have a means to tune the frequency of the frequency discriminator.

In a preferred embodiment of this invention, the tuning of an all-fibered or waveguide Mach-Zehnder and Michelson interferometer is performed by changing the effective optical length of one arm of the interferometer. This is preferably done using heating elements that change the temperature of the fiber used to create the interferometric path delay. A piezo transducer can also be used to create length changes through mechanical constraints on part of the fiber.

In another preferred embodiment, a thermistor can be installed in the interferometer in order to measure the internal temperature of the fiber. In a preferred operating mode, the temperature is used as an error signal to stabilize the interferometer to a pre-set temperature by the sequencer upon start-up. The sequencer would ideally wait until the temperature is stable before enabling the laser frequency locking loop.

Alternatively, it could be advantageous for the sequencer to simply send a fixed current into the heater element and wait until the frequency error signal stabilizes before activating the frequency locking loop. The frequency discriminator can then be tuned in both directions by increasing or decreasing the heating current around this set point. This procedure using an initial pre-set temperature allows the interferometer to operate over wider external temperature changes Alternatively, PZT elements to stretch the path delay fiber, or both PZT and heating elements, could be used.

Once the laser is locked, the burden of providing a stable frequency reference no longer relies on the laser but on the interferometer. Packaging an interferometer to be immune to acoustic and mechanical vibrations is much easier than redesigning the structure of a fiber laser or a YAG laser. The packaging can therefore be optimized for the specific kind of environment. For example, to reduce the cost, weight and size penalty of packaging for noisy environments, many lasers at different wavelengths could share the same interferometer placed in a single noise-immune package, or multiple interferometer could share the same packaging.

Figure 5:
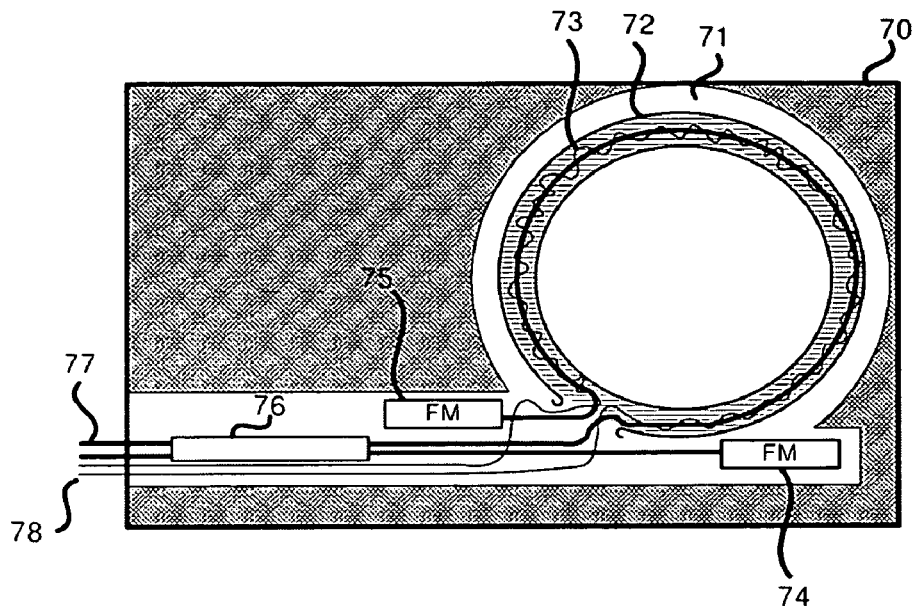
FIG. 5 is a top view of an enclosure and a frequency discriminator enclosed therein according to the invention.

FIG. 5 illustrates a preferred embodiment of a Michelson interferometer that could be used in a frequency discriminator. This interferometer has been packaged to provide good immunity to the external acoustic, mechanical and thermal perturbations. In the illustrated embodiment, the interferometer package consists in a solid block of metal (70) in which a cavity (71) is machined. The block advantageously provides a high rigidity, reflects acoustic noise and has a large thermal mass to improve thermal stability of the interferometer. As illustrated, the cavity contains a single-mode optical coupler (76) that splits the incoming light into two outputs. One output goes directly toward a pigtailed Faraday Mirror which reflects back the light toward the coupler while turning its polarization by 90 degrees. The other output goes into a length of fiber rolled inside the cavity and eventually ending on another Faraday Mirror. The length difference between the two fibers determines the differential path delay of the interferometer. A small metallic wire (73) is advantageously twisted around the long fiber. By applying a current to this wire, the temperature of the fiber can be changed and the interferometer can be frequency-tuned. A protection envelope (73) made of thermally and electrically insulating material ensures that the heat is not lost in the metallic body of the interferometer.

In a further preferred embodiment, acoustic absorbent material (not shown) is placed around the package to improve its immunity to acoustic noise and provide additional thermal stability.

Moreover, an optional suspension system can be added to the structure to improve the immunity to mechanical vibrations. The high mass of the structure is advantageous in the situations where high frequency mechanical noises must be filtered out.

Figure 6:
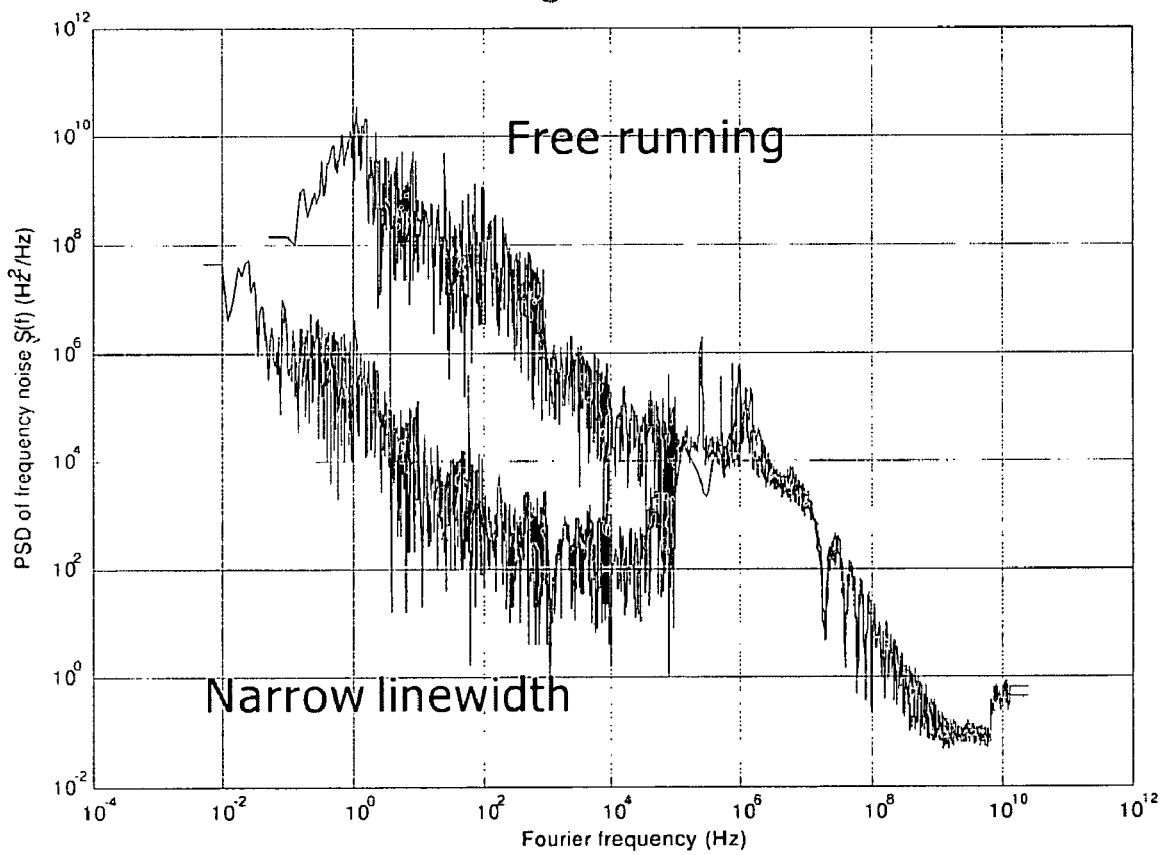
FIG. 6 illustrates the power spectral density of the frequency noise of a laser device in a free running and a frequency locked position, according to the present invention.

FIG. 6 illustrates the power spectral density (PSD) of frequency noise of the laser with and without frequency locking on an all-fiber Michelson interferometer. The PSD is expressed in units of $Hz^2/Hz$. The curve should be divided by $f^2$ to convert it to a PSD of phase noise.

The spectrum of the free-running laser approximately follows a 1/f curve up to 10 kHz. This indicates flicker frequency noise. Beyond 10 kHz, we have an approximately white frequency noise. The rapid decrease of the measured frequency noise after 10 MHz is caused by the intrinsic response of the measurement interferometer. This response has a $sinc^2$ shape and has its first zero at 20 MHz we did not compensate for the interferometer effect in the previous graph. The frequency noise tends to drop off at the lowest frequencies due to the fact the measurement interferometer was tracking the very low frequency drifts of the laser, therefore reducing the perceived frequency fluctuations.

The figure clearly shows the effect of the linewidth reduction. The frequency noise power is reduced by at least four orders of magnitude within the locking loop bandwidth which was set at a few hundreds of kHz in this measurement. Better noise reduction can be achieved by increasing the bandwidth of the locking loop. This is done by increasing the gain of the loop and fine tuning the feedback compensation filter to the laser.

Figure 7:
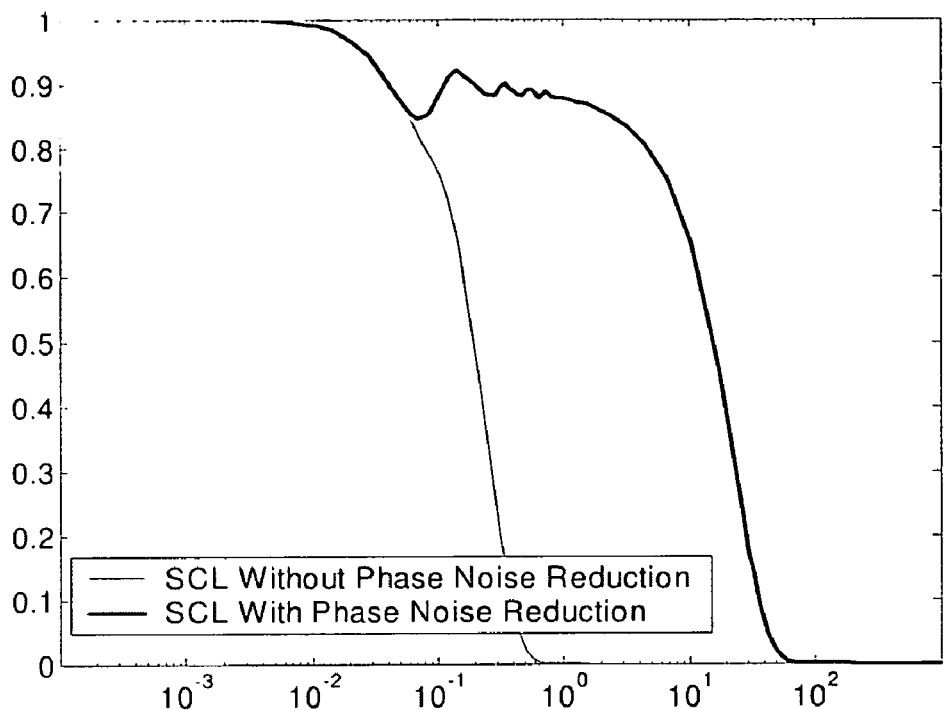
FIG. 7 illustrates the degree of coherence of a laser device as a function of an interferometer length in fiber, in a free running and a frequency locked position, according to the present invention.

FIG. 7 shows the degree of coherence of the laser as a function of interferometer length in fiber, with and without frequency locking. The frequency noise reduction system moves the coherence length (at 50% coherence) of the laser from 200 m to almost 16 km. These coherence plots were computed from the experimental PSD of frequency noise shown above for a measurement time of 1 ms.

One can see that the linewidth reduction effectively increases the coherence length of the semiconductor laser and makes them usable in applications where only fiber laser or YAG lasers could be used before. It must be noted however that in this case the linewidth reduction system does not improve the coherence length for degrees of coherence higher than 90%. This is due to the fact that some of the high frequency noise of the laser is not compensated by the locking loop. A higher locking bandwidth would improve this result.

Figure 8:
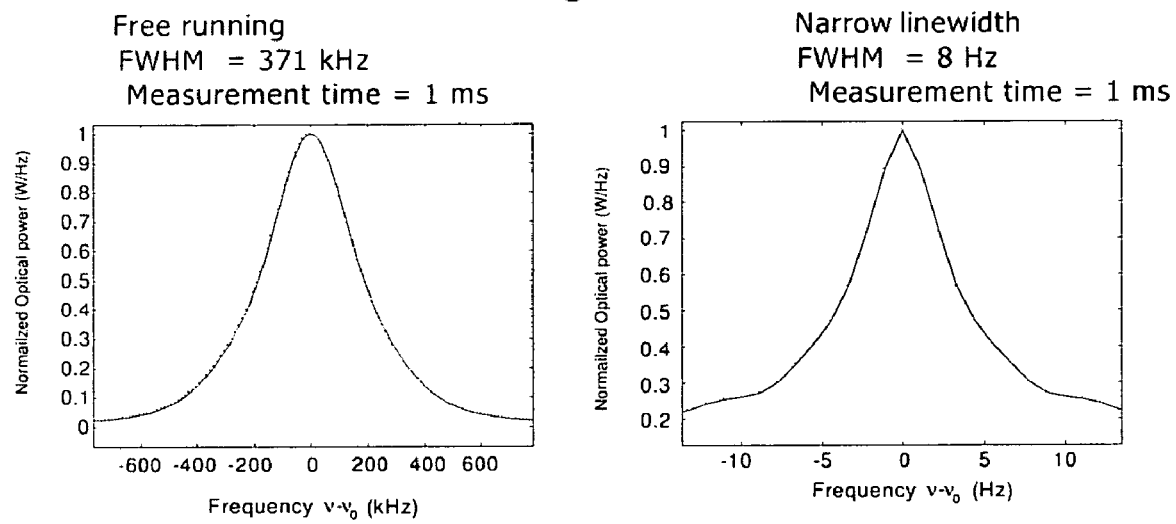
FIG. 8 illustrates the output signal of a laser device, in a free running and a frequency locked position, according to the present invention.

FIG. 8 shows the lineshape of the semiconductor laser with and without linewidth reduction. These were also computed from the measured PSD of frequency noise for a 1 ms measurement time.

It is important to note that the measurement time has an incidence on the computed or measured linewidth and must be specified whenever a linewidth value is mentioned. Indeed, since the laser possesses 1/f frequency noise, the frequency excursions of the laser will be larger as we measure the linewidth of the laser over longer periods of time. We chose to use 1 ms as a typical measurement time, but the effective measurement time will depend on the particular application.

The computations show that the linewidth of the free running laser is close to 400 kHz FWHM, which is consistent with the measurement taken by measuring the beat note between two free running lasers. The effect of the linewidth reduction system is quite dramatic, bringing the linewidth down to 8 Hz FWHM. This means that the interferometer frequency drift and noise was lass than 8 Hz over that time period. Of course, measuring the linewidth over longer periods of time will yield results in the hundreds of Hz, but the results are still better than YAG and fiber lasers.

Free-running DFB semiconductor lasers have a very attractive tuning capability. Indeed, a typical SCL can be tuned by more than 1 nm (125 GHz @ 1550 nm) by changing its junction temperature with the thermo-electric cooler integrated in the laser package. Since this tuning process is thermal, it will take a few seconds to stabilize the laser at a new frequency. The optical frequency of the laser can also be tuned by changing the injection current of the laser. Although this also changes the power output of the laser, the tuning response is very fast, and a frequency switch of a few GHz can be done in a few milliseconds or less. One must be aware that large injection current changes may also affect the equilibrium temperature of the semiconductor junction, therefore creating an additional slow tuning that needs to be taken into account.

When the DFB laser is frequency-locked to an interferometer, however, its frequency is determined by that interferometer. This does not mean that the laser cannot be tuned anymore, but rather that it can be tuned with more restrictions. Indeed, four tuning modes are possible with a linewidth-reduced laser.

Figure 9A:
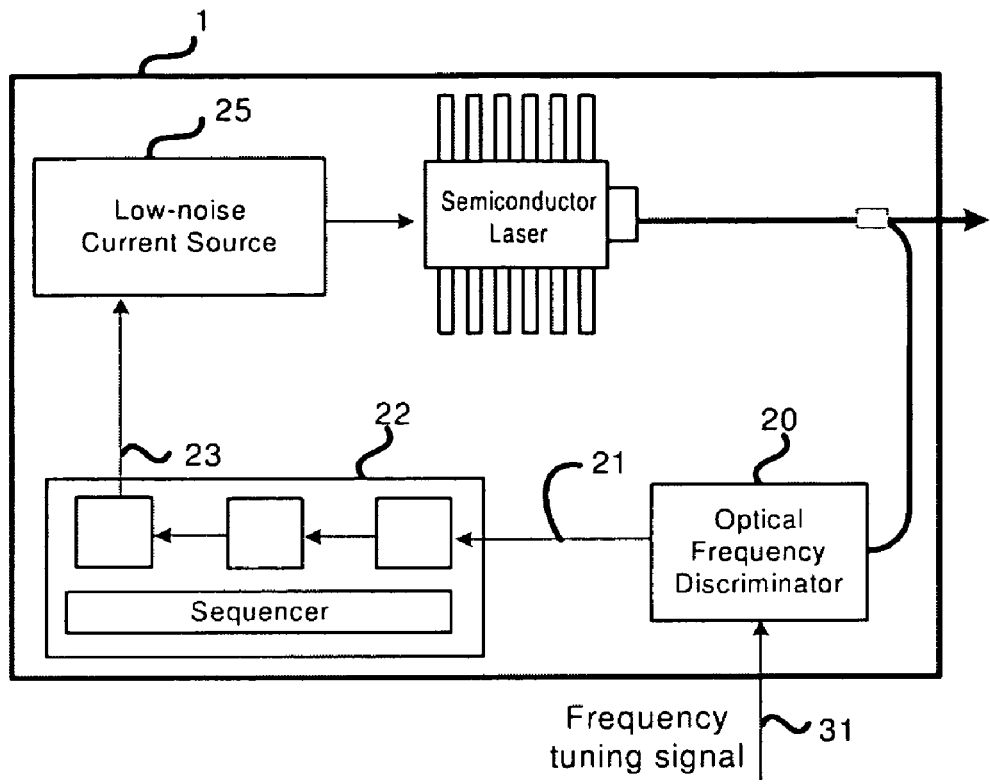
FIG. 9A is a schematic representation of a narrow linewidth semiconductor laser device according to another preferred embodiment of the present invention.

The first tuning mode is illustrated in FIG. 9A. The frequency of the interferometer can also be tuned by the tuning means described before. Since the laser is frequency-locked on one fringe, the laser frequency will track the frequency changes of the frequency discriminator. This would provide a continuous frequency tuning. If the frequency discriminator is a periodic filter such as a resonator or an interferometer, the tuning of the frequency discriminator can allow the laser to be tuned over many resonance modes or interference fringes. The initial tuning of the frequency discriminator may be performed by a control signal provided by the sequencer.

Figure 9B:
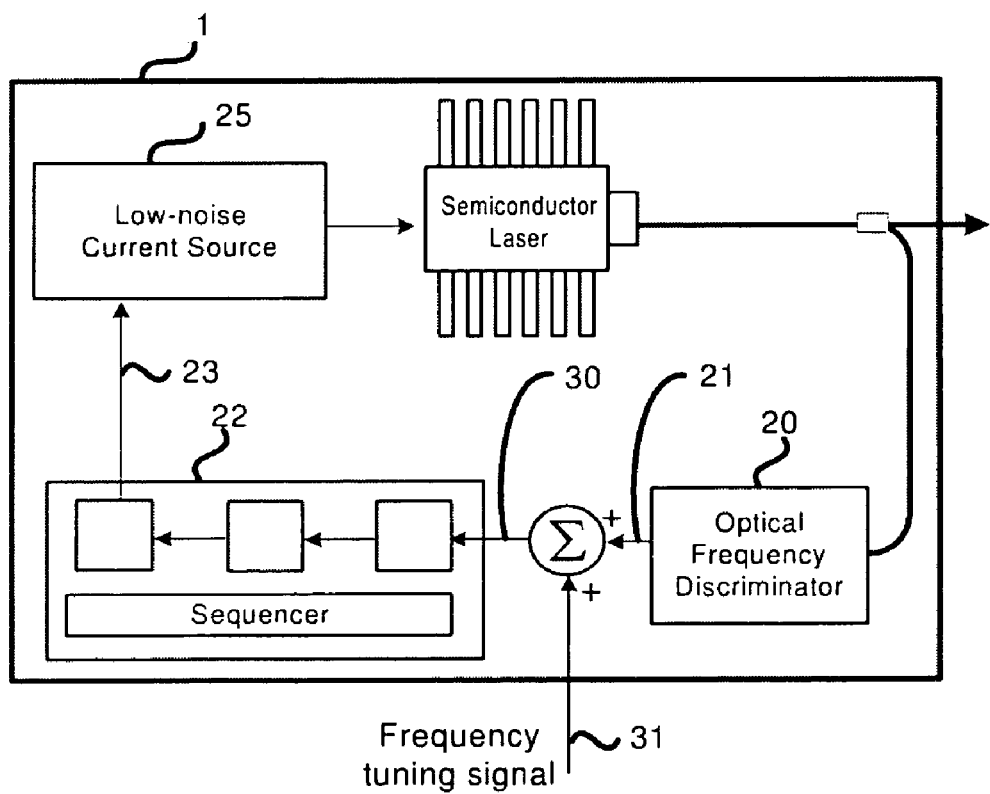
FIG. 9B is a schematic representation of a narrow linewidth semiconductor laser device according to another preferred embodiment of the present invention.

FIG. 9b illustrates the second tuning mode which consists in changing the locking point on the interferometer response by offsetting the frequency error signal. The locking loop will shift the frequency of the laser to track this offset within its locking bandwidth. This advantageously allows continuous, fast tuning with a bandwidth of about a few MHz and a maximum frequency excursion typically of a few tens of MHz. If the frequency discriminator is a periodic filter such as a resonator or interferometer, the tuning range extends only within one resonator mode or interference fringe.

Figure 9C:
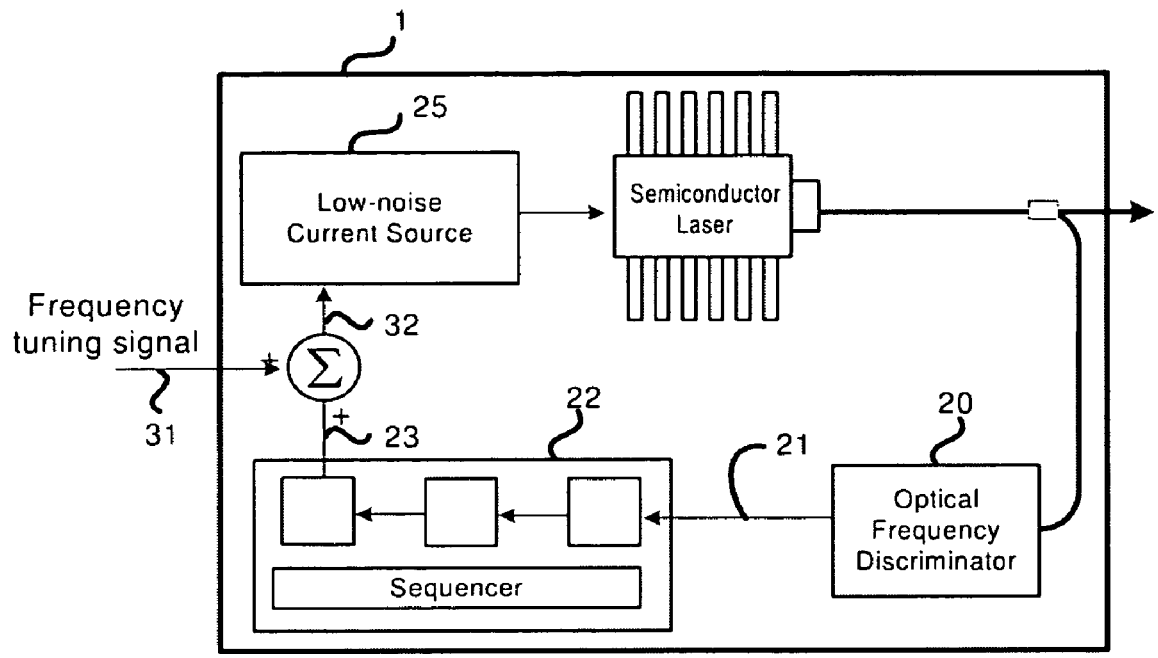
FIG. 9C is a schematic representation of a narrow linewidth semiconductor laser device according to another preferred embodiment of the present invention.

FIG. 9c illustrates the third tuning mode. In this mode, high frequency modulation of the laser frequency can advantageously be performed directly on the injection current of the laser as long as it occurs well beyond the bandwidth of the frequency locking loop. In this case, the frequency locking loop will not be able to compensate the injection current changes quickly enough and the frequency modulation will appear of the laser output.

Figure 9D:
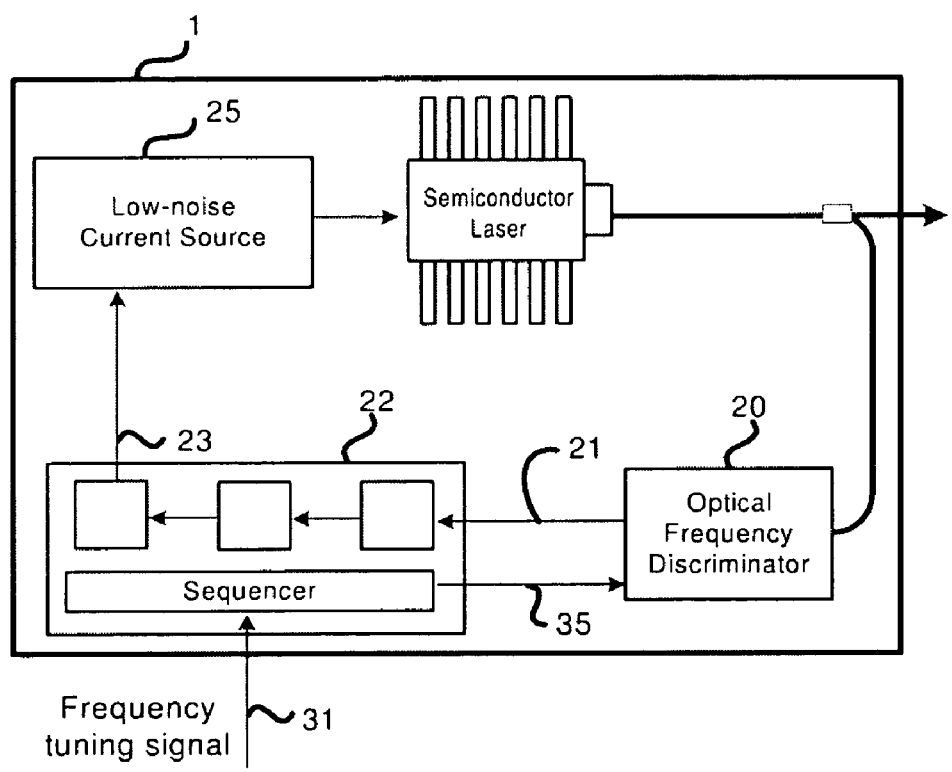
FIG. 9D is a schematic representation of a narrow linewidth semiconductor laser device according to another preferred embodiment of the present invention.

FIG. 9d illustrates another preferred embodiment where the narrow linewidth laser can be tuned by changing the resonance mode or interference fringe on which the laser is locked. In that case, the fringe switching can be very fast if it is done within the injection current tuning range, and wider tuning can be achieved by the slower thermal tuning of the laser. The full tuning range of the free-running laser is therefore accessible. The target frequencies will be an integer multiple of the frequency spacing between the fringes or modes of frequency discriminator (typically smaller than 50 MHz). The controller plays an important role in automating the tuning of the laser. The tuning sequence is advantageously performed as follows:

First, the controller received a request that the user requires the laser to be tuned at a new frequency. The request is sent through the frequency control signal (31), which can be an analog signal or a digital signal transmitted over a standard communication protocol.

Second, the laser disables the frequency locking of the laser.

Third, the controller tunes the frequency of the laser to the desired frequency by changing its injection current through the current tuning signal (23). While the tuning is being performed, the controller can advantageously monitor the error signal coming from the frequency discriminator to keep accurate tracking of the frequency changes. For example, if an interferometer is used, the controller can count the fringes until a predetermined number of transitions have been observed. If the fringe spacing of the interferometer is well known, very accurate tuning can therefore be achieved.

Fourth, once the laser frequency is close to the target frequency, the locking loop is reactivated and the laser frequency locks on the nearest frequency reference.

Fifth, the controller can optionally signal the user that the tuning is successfully completed through a visual indicator, an analog signal or a digital signal.

Of course, the linewidth reduction is disabled during the tuning period, but since the user requires the laser frequency to change rapidly, the spectral purity of that laser may not be an issue during the short frequency transition period.

A combination of these four tuning mechanisms can advantageously be used to implement the tuning capabilities required for the particular applications. The embedded digital controller can advantageously handle all tuning operations and offer a simple tuning interface to the user.

Figure 12:
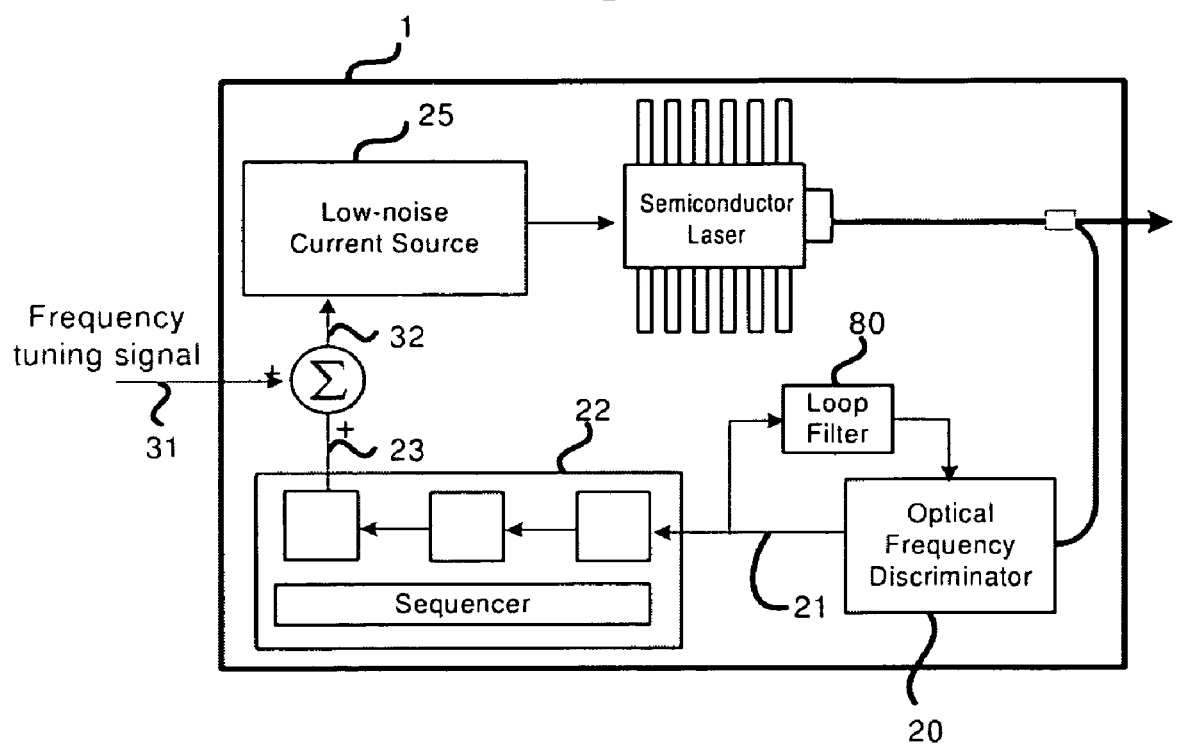
FIG. 12 is a schematic representation of a narrow linewidth semiconductor laser device according to another preferred embodiment of the present invention.

In another preferred embodiment illustrated in FIG. 12, the loop filter (22) can possess a high-pass frequency response so that only high frequency fluctuations of the laser are compensated. No correction of the laser frequency is therefore done at low frequencies and slow changes in the injection current of the laser will affect the laser frequency. In this embodiment, an additional locking loop ensures that the frequency discriminator tracks the low frequency variations of the laser. A loop filter (80) observes the frequency error signal (21) and generates the frequency correction signal that is applied to the tuning means of the frequency discriminator. This allows the direct frequency tuning of the laser by the input signal (31), which advantageously allows an external tuning capability of the laser frequency.

Typical frequency discriminators such as resonators and interferometers provide an excellent short- and medium-term stability to the semiconductor laser but temperature changes will cause their frequency—and therefore the frequency of the laser—to slowly change with time. If an accurate long-term stability is required, an active frequency stabilization scheme must therefore be used.

Figure 10:
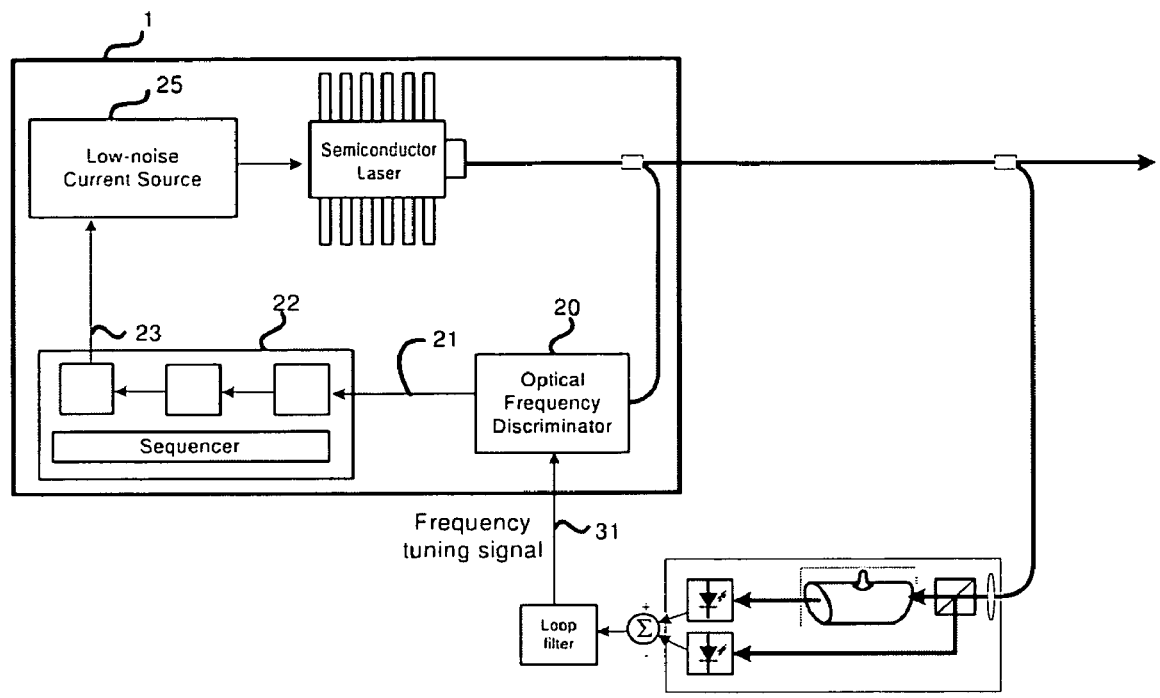
FIG. 10 is a schematic representation of a narrow linewidth semiconductor laser device according to another preferred embodiment of the present invention.

FIG. 10 illustrate another preferred embodiment of the invention where the frequency of the narrow linewidth semiconductor laser is locked on an additional external frequency reference to improve its stability. The simplest references that can be used are atomic or molecular gases, which have very narrow absorption lines at optical frequencies of interest. Moreover, these lines are very stable with time and environmental changes. $C_2H_2$, HCN, $H_2O$, $CH_4$, $CO_2$) and atomic (Rb, Cs) gas references, or a combination of gases and other optical filters can advantageously be used. A gas embedded in cavities of a holey optical fiber could also advantageously be used.

Depending of the requirements, many frequency stabilization techniques can be used with these gaseous references. One preferred, low cost method consists in locking the laser on the side of the absorption line. This technique works by comparing the level of light transmitted through the cell to a reference level. It does not require any laser frequency or phase modulation of the laser output. It is a low cost and easy method to implement, however, a compromise has to be done on the stability and accuracy performances attainable. Typical relative stabilities are on the order of $10^{-8}$ to $10^{-9}$ over 100 s averaging time.

This system is similar to the basic narrow linewidth laser device shown in FIG. 1, with the addition of an additional tap on the laser output which sends the light in a small module containing a glass cell, a collimator, beam splitter and two photodetectors. The two photodetectors sense the power of the light that passes inside and outside the gas cell. The difference between the two power levels served as an error signal that is used to determine in which direction the laser frequency has drifted. A correction signal is then sent on the narrow linewidth laser tuning signal to bring back the laser frequency to the target point of the absorption line of the gas. The tuning signal can by preferably applied to the frequency discriminator tuning signal (FIG. 9A), or by applying an offset on the frequency error signal (FIG. 9B), or by applying an offset on the correction signal of a AC-coupled feedback circuit (FIG. 12). Both signals can be used simultaneously with specially designed loop filters to achieve both a high locking bandwidth and large tuning range.

The bandwidth of the frequency locking loop must be adjusted to transfer this stability to the interferometer while not disturbing its natural stability over the shorter time scales. The long term frequency stability of this edge-locking system is limited by the stability of the electronic components in the loop.

At power-up, the embedded controller is responsible for automatically tuning the laser until it finds the desired absorption line and enables the locking loop in the proper sequence to ensure that the narrow linewidth laser frequency is locked on the appropriate absorption line.

Other frequency locking methods can alternatively be used to achieve even better relative frequency stabilities. For example, the laser can be locked to the bottom of the absorption line using an external phase modulation. In this case, an external modulator is used to modulate the frequency or the phase of a sample of the laser output in order to interrogate the reference gas cell. A synchronous detection scheme is used to lock the laser frequency at the bottom of the transmission pattern. This method offers the best accuracy and stability performances. This method has the great advantage that the laser output signal bears no modulation. Typical relative stabilities are on the order of $10^{-9}$ over 100 s if we use the linear absorption of molecular gases, and can go down to $10^{-11}$ and $10^{-12}$ by using the saturated absorption or two photon transition of atomic gases (such as Rubidium).

Although preferred embodiments of the present invention have been described in detail herein and illustrated in the accompanying drawings, it is to be understood that the invention is not limited to these precise embodiments and that various changes and modifications may be effected therein without departing from the scope or spirit of the present invention

What is claimed is:

1. A narrow linewidth semiconductor laser device comprising:
    a semiconductor laser having a predetermined frequency noise spectrum and a predetermined tuning response, said semiconductor laser further having tuning means and operating at an optical frequency tuneable by said tuning means, said laser providing an output signal;
    a low noise current source operatively connected to said laser for supplying current thereto, said current source being particularly adapted to prevent a significant degradation of the frequency noise spectrum of the laser;
    an optical frequency discriminator for establishing a frequency reference for said laser, said optical frequency discriminator having a predetermined frequency response and being operatively connected to a portion of the output signal of said laser, the optical frequency discriminator providing an error signal representative of a noise in the frequency of said laser with respect to said frequency reference;
    control means operatively connected to said error signal and to said laser tuning means, said control means providing a frequency feedback signal to the tuning means in response to said error signal and comprising:
        distinct compensation networks for compensating the error signal with respect to the frequency response of said frequency discriminator, the frequency noise spectrum of said laser and the tuning response of said laser, respectively; and
        sequencing means for enabling an automatic frequency locking of said laser on the frequency reference of said optical frequency discriminator, the sequencing means controlling a power-up sequence of said frequency locking; and
    an enclosure for enclosing said frequency discriminator to isolate said frequency discriminator from external perturbations.

2. The narrow linewidth semiconductor laser device according to claim 1, further comprising a splitter for splitting the output signal of said laser to provide said portion of said output signal to said optical frequency discriminator.

3. The narrow linewidth semiconductor laser device according to claim 1, wherein said optical frequency discriminator comprises a Mach-Zehnder interferometer.

4. The narrow linewidth semiconductor laser device according to claim 1, wherein said optical frequency discriminator comprises a Michelson interferometer.

5. The narrow linewidth semiconductor laser device according to claim 1, wherein said frequency discriminator comprises an all-fibered Michelson interferometer and first and second Faraday mirrors mounted therewith.

6. The narrow linewidth semiconductor laser device according to claim 1, wherein said optical frequency discriminator comprises an all fibered interferometer.

7. The narrow linewidth semiconductor laser device according to claim 1, wherein said frequency discriminator is implemented as waveguide in a photonic lightwave circuit.

8. The narrow linewidth semiconductor laser device according to claim 1, wherein said optical frequency discriminator comprises an optical fiber having a hollow portion extending therein.

9. The narrow linewidth semiconductor laser device according to claim 8, wherein said discriminator further comprises a reference gas enclosed in the hollow portion of said optical fiber.

10. The narrow linewidth semiconductor laser device according to claim 1, wherein said frequency discriminator comprises a tuning means for tuning the frequency reference of said discriminator, said control means being adapted to control said tuning means.

11. The narrow linewidth semiconductor laser device according to claim 10, wherein said tuning means for tuning the frequency reference comprises a heating element.

12. The narrow linewidth semiconductor laser device according to claim 11, wherein said frequency discriminator comprises a fibered interferometer, said heating element comprising an electrical wire extending in closed proximity of said fibered interferometer.

13. The narrow linewidth semiconductor laser device according to claim 12, wherein said fibered interferometer is provided with a plastic casing surrounding said fibered interferometer and said electrical wire.

14. The narrow linewidth semiconductor laser device according to claim 10, wherein said tuning means for mechanically tuning the frequency reference of said frequency discriminator comprises a mechanical transducer.

15. The narrow linewidth semiconductor laser device according to claim 1, further comprising a frequency tuning offset signal applied on said error signal, thereby allowing frequency tuning of said laser.

16. The narrow linewidth semiconductor laser device according to claim 1, further comprising a fast modulated frequency tuning signal applied on said frequency feedback signal, thereby allowing frequency tuning of said laser.

17. The narrow linewidth semiconductor laser device according to claim 1, wherein said power-up sequence comprises initially disabling the frequency locking of said laser for allowing frequency tuning of said laser by current injection with the help of said current source before enabling said frequency locking of said laser.

18. The narrow linewidth semiconductor laser device according to claim 1, wherein said error signal is substantially proportional to a difference between the optical frequency of the laser and the frequency reference of the frequency discriminator.

19. The narrow linewidth semiconductor laser device according to claim 1, wherein said control means can be remotely operated.

20. The narrow linewidth semiconductor laser device according to claim 1, wherein said frequency feedback signal is operatively connected to said current source for tuning the optical frequency of said laser by current injection.

21. The narrow linewidth semiconductor laser device according to claim 1, wherein said tuning means of the laser comprise thermal tuning means for thermally tuning the optical frequency of said laser.

22. The narrow linewidth semiconductor laser device according to claim 21, wherein said frequency feedback signal is operatively connected to said current source for allowing to tune the optical frequency of said laser by current injection and in a thermal manner.

23. The narrow linewidth semiconductor laser device according to claim 1, wherein said sequencing means comprises:

monitoring means for monitoring the error signal of the frequency discriminator; and enabling means for enabling the feedback network once said laser is in a stable state.

24. The narrow linewidth semiconductor laser device according to claim 1, wherein said frequency discriminator comprises a tuning means for tuning the frequency reference of said discriminator, said sequencing means comprising:

monitoring means for monitoring the error signal of the frequency discriminator; and enabling means for enabling the feedback network once said frequency reference of said discriminator is conveniently tuned and said laser is in a stable state.

25. The narrow linewidth semiconductor laser device according to claim 1, wherein said enclosure comprises a rigid metallic plate provided with a cavity extending therein for receiving said frequency discriminator.

26. The narrow linewidth semiconductor laser device according to claim 25, wherein said enclosure further comprises an acoustic foam surrounding said frequency discriminator.

27. The narrow linewidth semiconductor laser device according to claim 1, wherein said laser has a detector providing a laser power signal for allowing to reference said error signal to said laser power signal.

28. The narrow linewidth semiconductor laser device according to claim 1, further comprising at least one additional optical frequency discriminator for allowing to feedback a plurality of semiconductor lasers, each of said optical frequency discriminators being enclosed together in said enclosure.

29. The narrow linewidth semiconductor laser device according to claim 1, further comprising at least one additional semiconductor laser and at least one additional optical frequency discriminator.

30. The narrow linewidth semiconductor laser device according to claim 1, wherein said frequency discriminator has a predetermined frequency noise spectrum, and said control means further comprise an additional distinct compensation network for compensating the error signal with respect to said frequency noise spectrum of the frequency discriminator.

* * * * *